(12) United States Patent
Kano

(10) Patent No.: US 7,166,362 B2
(45) Date of Patent: Jan. 23, 2007

(54) FILM-FORMING COMPOSITION, PRODUCTION PROCESS THEREFOR, AND POROUS INSULATING FILM

(75) Inventor: Takeyoshi Kano, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 245 days.

(21) Appl. No.: 10/807,391

(22) Filed: Mar. 24, 2004

(65) Prior Publication Data

US 2005/0074556 A1  Apr. 7, 2005

(30) Foreign Application Priority Data

Mar. 25, 2003  (JP)  ............... 2003-081736

(51) Int. Cl.
*B32B 9/04* (2006.01)
(52) U.S. Cl. .......... 428/447; 521/63; 427/373; 427/379; 427/387
(58) Field of Classification Search .......... 428/447; 427/373, 379, 387; 521/63
See application file for complete search history.

(56) References Cited

U.S. PATENT DOCUMENTS

| | | | | |
|---|---|---|---|---|
| 4,061,503 | A * | 12/1977 | Berger et al. ............. | 106/445 |
| 4,652,610 | A * | 3/1987 | Dowbenko et al. ......... | 525/100 |
| 5,223,495 | A * | 6/1993 | Inoue et al. ................ | 524/188 |
| 6,069,200 | A * | 5/2000 | Chen et al. ................ | 524/547 |
| 6,316,572 | B1 * | 11/2001 | Nambu et al. ............. | 528/33 |
| 6,733,884 | B2 * | 5/2004 | Brown ....................... | 428/404 |
| 7,001,673 | B2 * | 2/2006 | Yamasaki et al. .......... | 428/626 |

FOREIGN PATENT DOCUMENTS

| | | |
|---|---|---|
| JP | 2000-328004 A | 11/2000 |
| JP | 2001-329217 A | 11/2001 |
| JP | 2002-285086 A | 10/2002 |
| JP | 2002-293824 | * 10/2002 |

* cited by examiner

*Primary Examiner*—Margaret G. Moore
(74) *Attorney, Agent, or Firm*—Sughrue Mion, PLLC

(57) ABSTRACT

There are provided a film-forming composition that includes a hydrolysis product and/or a condensation product of a compound having a repeating unit represented by Formula (1) below.

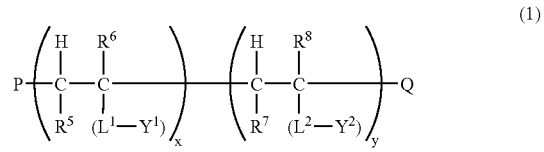

(1)

(In the formula, at least one of P and Q is a silane coupling group represented by $-L^3-Si(R^3)_m(OR^4)_{3-m}$, $R^3$ to $R^8$ independently denote H or a hydrocarbon group (C1 to 8), m denotes 0, 1, or 2, x denotes 100 to 1 mol %, y denotes 0 to 99 mol %, and P and Q denote terminal groups; $L^1$ to $L^3$ independently denote a single bond or a divalent organic linking group, $Y^1$ and $Y^2$ independently denote $-N(R^9)(R^{10})$, $-OH$, $-NR^0COR^9$, $-CON(R^9)(R^{10})$, $-OR^9$, $-CONR^9_2$, $-COR^9$, $-CO_2M$, $-COOR^9$, or $-SO_3M$, in which $R^0$, $R^9$, and $R^{10}$ independently denote H or alkyl (C1 to 8), $R^0$ and $R^9$ may form a ring, and M denotes H, an alkali metal, an alkaline earth metal, or onium.)

11 Claims, No Drawings

FILM-FORMING COMPOSITION, PRODUCTION PROCESS THEREFOR, AND POROUS INSULATING FILM

BACKGROUND OF THE INVENTION

1. Field of the Invention

The present invention relates to a material for forming an insulating film and, more particularly, it relates to an insulating film-forming material that, as a material for an interlayer insulating film in a semiconductor device, etc., can form a coating having an appropriate, uniform thickness and, furthermore, is resistant to cracking and has excellent permittivity characteristics.

2. Description of the Related Art

Conventionally, as interlayer insulating films in semiconductor devices, etc., silica ($SiO_2$) films formed by a vacuum process such as a chemical vapor deposition (CVD) process have been frequently used. Furthermore, in recent years, in order to form a more uniform interlayer insulating film, a coated type insulating film containing as a main component the hydrolysis product of a tetraalkoxysilane, known as a SOG (Spin on Glass) film, has come into use. Moreover, accompanying the higher integration of semiconductor devices, etc., a low permittivity interlayer insulating film containing as a main component a polyorganosiloxane, known as an organic SOG, has been developed.

However, the permittivity of a $CVD$-$SiO_2$ film, which shows the lowest permittivity among inorganic material films, is on the order of 4. The permittivity of an SiOF film, which has been recently investigated as a low permittivity CVD film, is approximately 3.3 to 3.5, but this film is highly hygroscopic, and there is therefore the problem that its permittivity increases during use.

On the other hand, with regard to organic polymer films showing a permittivity as low as 2.5 to 3.0, the glass transition temperature thereof is as low as 200° C. to 350° C., the thermal expansion thereof is large, and there is therefore the problem that wiring might be damaged. Furthermore, the organic SOG film has the disadvantage that cracks are caused as a result of oxidation by oxygen plasma ashing used for stripping a resist, etc. when forming a multilayer wiring pattern.

Furthermore, since an organic resin containing the organic SOG has poor adhesion to aluminum, aluminum-based alloys, copper, and copper-based alloys, which are used as wiring materials, voids (cavities formed between the wiring and an insulating material) are formed beside the wiring and water is trapped therein, thus causing the possibility of corrosion of the wiring. Moreover, these voids beside the wiring will cause a short circuit between wiring layers if misalignment occurs when opening a via hole for the formation of multilayer wiring, thus degrading the reliability.

Under such circumstances, as an insulating film material having excellent insulation, thermal resistance, and durability, an insulating film-forming coating type composition containing an organopolysiloxane is known (ref. JP-A-2001-329217; JP-A denotes a Japanese unexamined patent application publication). Furthermore, a method for reducing the permittivity by making an organopolysiloxane porous is also known (ref. JP-A-2002-285086). Moreover, a method is known for forming a porous insulating film by synthesizing an organopolysiloxane by use of a silicon compound having a C4 or higher substituent, and decomposing a C4 or higher alkyl group component by heating (ref. JP-A-2000-328004).

However, accompanying the increasingly highly, integrated and multilayered structure of semiconductor devices, etc., there has been a demand for better electrical insulation between conductors, and there has been a desire for an interlayer insulating film material having a lower permittivity and excellent resistance to cracking, heat, and chemical mechanical polishing (CMP).

The above-mentioned known insulating film-forming materials containing a polysiloxane do not have adequate permittivity characteristics, and even if the permittivity characteristics can be reduced by porosification, since the distribution of the pores in the film is uneven, there are the problems that the areas where the pores are unevenly distributed become brittle, and the resistance to CMP becomes poor.

BRIEF SUMMARY OF THE INVENTION

The present invention therefore relates to a film-forming composition and a silicone-based film formed therefrom that can solve the above-mentioned problems and, more particularly, the object thereof is to provide a film-forming composition that can form a silicone-based film that is suitably used as an interlayer insulating film in a semiconductor device, etc., and has an appropriate, uniform thickness and, moreover, has excellent thermal resistance and permittivity characteristics and, in particular, excellent resistance to CMP; a production process therefor; and a porous insulating film employing same.

It has been found that the above-mentioned object of the present invention can be achieved by the following means.

<1> A film-forming composition comprising a hydrolysis product and/or a condensation product of a compound having a repeating unit represented by Formula (1) below.

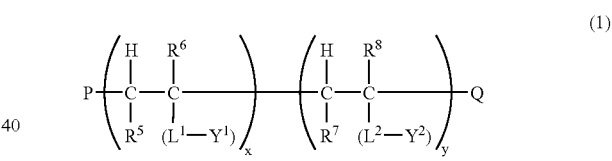

(1)

(In the formula, at least one of P and Q is a silane coupling group represented by $-L^3\text{-}Si(R^3)_m(OR^4)_{3-m}$, $R^3$, $R^4$, $R^5$, $R^6$, $R^7$, and $R^8$ independently denote a hydrogen atom or a hydrocarbon group having 1 to 8 carbons, m denotes 0, 1, or 2, x denotes a range of 100 to 1 mol %, y denotes a range of 0 to 99 mol %, x+y=100 and P and Q denote terminal groups; $L^1$, $L^2$, and $L^3$ independently denote a single bond or a divalent organic linking group, $Y^1$ and $Y^2$ independently denote $-N(R^9)(R^{10})$, $-OH$, $-NR^0COR^9$, $-CON(R^9)(R^{10})$, $-OR^9$, $-CONR^9_2$, $-COR^9$, $-CO_2M$, $-COOR^9$, or $-SO_3M$, in which $R^0$, $R^9$, and $R^{10}$ independently denote a hydrogen atom or an alkyl group having 1 to 8 carbons, $R^0$ and $R^9$ may form a ring structure, and M denotes a hydrogen atom, an alkali metal, an alkaline earth metal, or onium.)

<2> A process for producing a film-forming composition, the process comprising a step of hydrolyzing and/or condensing a compound having a repeating unit represented by Formula (1) below.

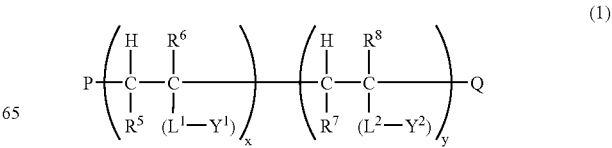

(1)

(In the formula, at least one of P and Q is a silane coupling group represented by -L$^3$-Si(R$^3$)$_m$(OR$^4$)$_{3-m}$, R$^3$, R$^4$, R$^5$, R$^6$, R$^7$, and R$^8$ independently denote a hydrogen atom or a hydrocarbon group having 1 to 8 carbons, m denotes 0, 1, or 2, x denotes a range of 100 to 1 mol %, y denotes a range of 0 to 99 mol %, x+y=100 and P and Q denote terminal groups; L$^1$, L$^2$, and L$^3$ independently denote a single bond or a divalent organic linking group, Y$^1$ and Y$^2$ independently denote —N(R$^9$)(R$^{10}$), —OH, —NR$^0$COR$^9$, —CON(R$^9$)(R$^{10}$), —OR$^9$, —CONR$^9{}_2$, —COR$^9$, —CO$_2$M, —COOR$^9$, or —SO$_3$M, in which R$^0$, R$^9$, and R$^{10}$ independently denote a hydrogen atom or an alkyl group having 1 to 8 carbons, R$^0$ and R$^9$ may form a ring structure, and M denotes a hydrogen atom, an alkali metal, an alkaline earth metal, or onium.)

<3> A porous insulating film formed by using a film-forming composition comprising a hydrolysis product and/or a condensation product of a compound having a repeating unit represented by Formula (1) below.

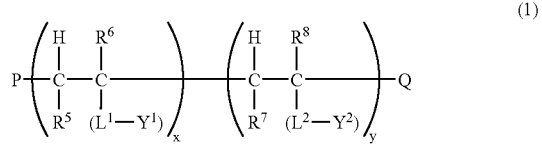

(1)

(In the formula, at least one of P and Q is a silane coupling group represented by -L$^3$-Si(R$^3$)$_m$(OR$^4$)$_{3-m}$, R$^3$, R$^4$, R$^5$, R$^6$, R$^7$, and R$^8$ independently denote a hydrogen atom or a hydrocarbon group having 1 to 8 carbons, m denotes 0, 1, or 2, x denotes a range of 100 to 1 mol %, y denotes a range of 0 to 99 mol %, x+y=100 and P and Q denote terminal groups; L$^1$, L$^2$, and L$^3$ independently denote a single bond or a divalent organic linking group, Y$^1$ and Y$^2$ independently denote —N(R$^9$)(R$^{10}$), —OH, —NR$^0$COR$^9$, —CON(R$^9$)(R$^{10}$), —OR$^9$, —CONR$^9{}_2$, —COR$^9$, —CO$_2$M, —COOR$^9$, or —SO$_3$M, in which R$^0$, R$^9$, and R$^{10}$ independently denote a hydrogen atom or an alkyl group having 1 to 8 carbons, R$^0$ and R$^9$ may form a ring structure, and M denotes a hydrogen atom, an alkali metal, an alkaline earth metal, or onium.)

DETAILED DESCRIPTION OF THE INVENTION

The present inventor has found that, in accordance with the insulating film-forming material of the present invention, since the compound component having a repeating unit represented by Formula (1) is dispersed evenly in the insulating film as described above, by heating and decomposing the organic component of the compound having the repeating unit represented by Formula (1), pores can be formed uniformly in the film. The present inventor also has found that the pores thus formed are more uniform and finer than conventionally formed pores and the resistance to CMP is increased, and the present invention has thus been accomplished.

The 'insulating film' referred to in the present invention denotes a film that is implanted between wiring in order to prevent wiring delay due to the multilayer wiring accompanying the increasing integration of ULSI and, more specifically, a film having a permittivity of 2.5 or less, and preferably 2.1 or less.

When a substrate such as a silicon wafer is coated with the composition of the present invention, which contains as a base polymer a polyorganosiloxane, by a dipping method, a spin coating method, etc., for example, channels between fine pattern lines can be filled sufficiently, and when carrying out organic solvent removal and a crosslinking reaction by heating, a film of a glass substance or a macromolecule, or a mixture thereof, can be formed. The film thus obtained can serve as a thick insulating film that has good thermal resistance, low permittivity, excellent reflow properties, no cracks, and excellent resistance to CMP.

The compounds used in the present invention are explained below in detail.

Hereinafter, various types of silicon compounds used in the present invention are also generally called 'Component (A)', and various types of nitrogen onium salt compounds are also generally called 'Component (B)'.

The hydrolysis/condensation product of Component (A) referred to in the present invention means a condensation product of a silanol group formed after the compound constituting Component (A) is hydrolyzed. In the condensation product, it is not necessary for all of the silanol groups to be condensed, and this concept includes a partially condensed product and a mixture of products having different degrees of condensation.

In the chemical structure represented by Formula (1) above, R$^3$, R$^4$, R$^5$, R$^6$, R$^7$, and R$^8$ independently denote a hydrogen atom or a hydrocarbon group having 8 or less carbons. The hydrocarbon group having 8 or less carbons is not particularly limited, but a straight-chain, branched, or cyclic alkyl group is preferable. Specific examples of the alkyl group include methyl, ethyl, propyl, butyl, pentyl, hexyl, heptyl, octyl, isopropyl, isobutyl, s-butyl, t-butyl, isopentyl, neopentyl, 1-methylbutyl, isohexyl, 2-ethylhexyl, 2-methylhexyl, and cyclopentyl, in which a hydrogen atom may be replaced with a fluorine atom, etc. R$^3$, R$^4$, R$^5$, R$^6$, R$^7$, and R$^8$ are preferably hydrogen atoms, methyl, or ethyl.

L$^1$, L$^2$, and L$^3$ denote single bonds or organic linking groups. The organic linking groups referred to here mean divalent linking groups comprising nonmetal atoms. More specifically, the organic linking groups comprise 1 to 60 carbon atoms, 0 to 10 nitrogen atoms, 0 to 50 oxygen atoms, 1 to 100 hydrogen atoms, and 0 to 20 sulfur atoms. L$^1$ and L$^2$ are preferably single bonds. As a specific example of L$^3$, an alkylenethio group such as trimethylenethio can be cited.

Y$^1$ and Y$^2$ independently denote —N(R$^9$)(R$^{10}$), —OH, —NR$^0$COR$^9$, —CON(R$^9$)(R$^{10}$), —OR$^9$, —CONR$^9{}_2$, —COR$^9$, —CO$_2$M, —COOR$^9$, or —SO$_3$M. Here, R$^0$, R$^9$, and R$^{10}$ independently denote a hydrogen atom or an alkyl group having 1 to 8 carbons, and R$^0$ and R$^9$ may form a ring structure. M denotes a hydrogen atom, an alkali metal, an alkaline earth metal, or onium. With regard to —N(R$^9$)(R$^{10}$), R$^9$ and R$^{10}$ may be bonded to each other to form a ring structure, and the ring structure thus formed can be a heterocycle containing a hetero atom such as an oxygen atom, a sulfur atom, or a nitrogen atom.

It is preferable for R$^0$, R$^9$, and R$^{10}$ to be independently a straight-chain, branched, or cyclic alkyl group having 8 or less carbons. Specific examples thereof include methyl, ethyl, propyl, butyl, pentyl, hexyl, heptyl, octyl, isopropyl, isobutyl, s-butyl, t-butyl, isopentyl, neopentyl, 1-methylbutyl, isohexyl, 2-ethylhexyl, 2-methylhexyl, and cyclopentyl.

Examples of the alkali metal denoted by M include lithium, sodium, and potassium. Examples of the alkaline earth metal include magnesium and calcium. Examples of onium include ammonium.

Specific examples of the terminal structure of the compound represented by Formula (1) are illustrated below together with the repeating units, but the present invention is not limited thereto.

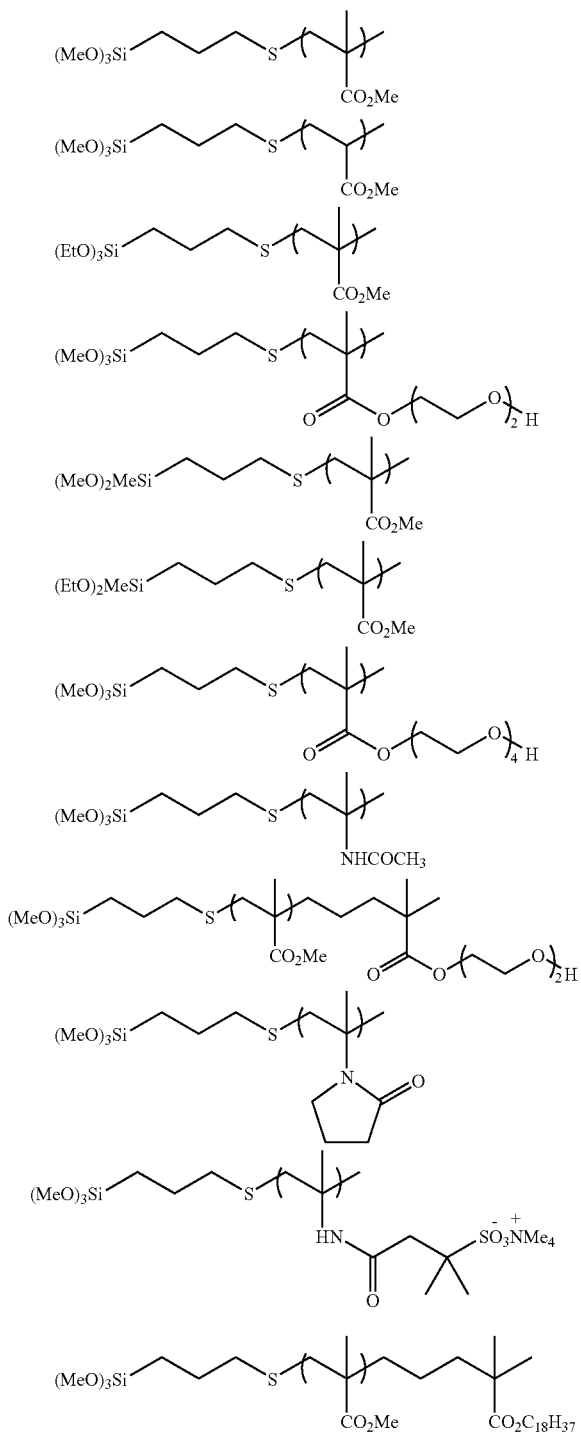

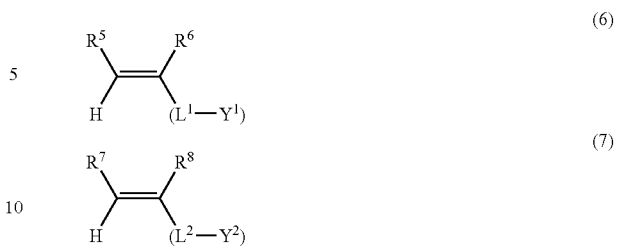

$$R^3{}_m(OR^4)_{3-m}\text{—Si-}L^3\text{-SH} \quad (8)$$

In Formulae (6), (7), and (8) above, $R^3$ to $R^8$, $L^1$, $L^2$, $L^3$, $Y^1$, and $Y^2$ have the same meanings as those of Formula (1). These compounds are commercially available and can also be synthesized easily.

Examples of ethylenically unsaturated monomers represented by Formulae (6) or (7) include an ethylenically unsaturated carboxylic ester monomer, an ethylenically unsaturated nitrile monomer, an aromatic vinyl monomer, an ethylenically unsaturated carboxylic acid monomer, and an ethylenically unsaturated carboxamide. In particular, the ethylenically unsaturated carboxylic ester monomer and the aromatic vinyl monomer are preferable, and the ethylenically unsaturated carboxylic ester monomer is more preferable.

Examples of the ethylenically unsaturated carboxylic ester monomer include methyl acrylate, methyl methacrylate, ethyl acrylate, butyl acrylate, β-hydroxyethyl acrylate, β-hydroxypropyl acrylate, β-hydroxyethyl methacrylate, glycidyl acrylate, glycidyl methacrylate, N,N-dimethylaminoethyl (meth)acrylate, and N,N-diethylaminoethyl (meth)acrylate. With regard to the alkoxy group of the ethylenically unsaturated carboxylic ester monomer, an ethyleneoxy group or an ethyleneoxy group repeating unit is preferably included.

Examples of the aromatic vinyl monomer include styrene, α-methylstyrene, monochlorostyrene, and vinyltoluene.

Examples of the ethylenically unsaturated carboxylic acid monomer include ethylenically unsaturated monocarboxylic acids such as acrylic acid, methacrylic acid, crotonic acid, and cinnamic acid; ethylenically unsaturated polycarboxylic acids such as itaconic acid, fumaric acid, maleic acid, and butenetricarboxylic acid; and partial esters of ethylenically unsaturated polycarboxylic acids such as monoethyl itaconate, monobutyl fumarate, and monobutyl maleate. In particular, the ethylenically unsaturated monocarboxylic acids are preferable, and methacrylic acid is more preferable.

Examples of the ethylenically unsaturated nitrile monomer include acrylonitrile and methacrylonitrile. In particular, acrylonitrile is preferable.

Examples of the ethylenically unsaturated carboxamide monomer include (meth)acrylamide and N-methylol(meth)acrylamide.

Other than the above-mentioned monomers, vinyl acetate, vinylpyrrolidone, vinylpyridine, etc. can be used.

These monomers can be used singly or in a combination of two types at a copolymerization ratio shown by Formula (1). It is also possible to use three or more types in combination.

Specific examples of the compounds represented by Formulae (6) or (7) are illustrated below, but the present invention is not limited thereto.

The compounds represented by Formula (1) above can be synthesized by radical polymerization from unsaturated compounds represented by Formulae (6) and (7) below and a mercapto group-containing silane compound represented by Formula (8) below. Since the mercapto group-containing silane compound (8) has chain transferability, a polymer having a silane coupling group introduced at the polymer main chain terminal can be synthesized in the radical polymerization.

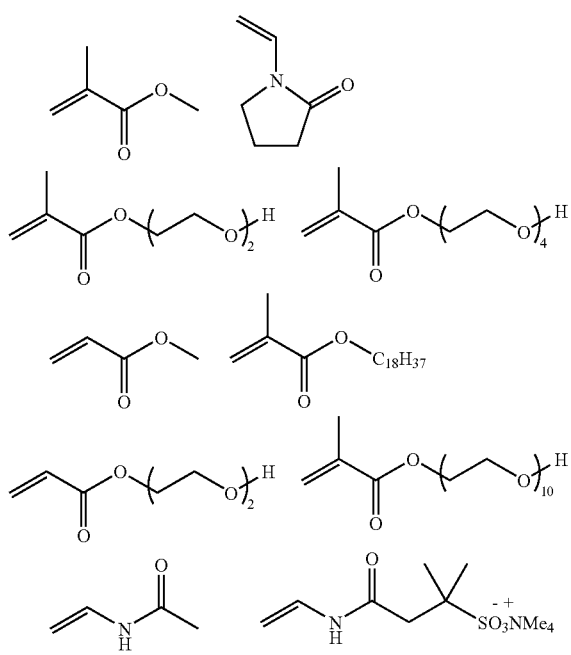

The manner in which the radical reaction of the mercapto group-containing silane compound represented by Formula (8) and the unsaturated compounds represented by Formulae (6) and (7) is carried out is not particularly limited, but the reaction is preferably carried out in the presence of a radical initiator or under irradiation with a high pressure mercury lamp, etc. by, for example, a bulk reaction, a solution reaction, or a suspension reaction (emulsion reaction). The polymerization system can also be selected as appropriate according to the intended purpose, and is for example a batchwise system (including a portionwise addition method and a successive addition method), a semicontinuous system, or a continuous system. In particular, the portionwise addition method (also known as the portionwise charging method) and the successive addition method (also known as the incremental method) for the unsaturated compounds are preferred polymerization methods since homopolymerization of the unsaturated compounds represented by Formulae (6) and (7) can be suppressed efficiently. For example, when the mercapto group-containing silane compound represented by Formula (8) and the unsaturated compounds represented by Formulae (6) and (7) are subjected to radical polymerization (molar ratio 1:1), although it depends on the polymerization temperature conditions, etc., it is known that, if radical polymerization is carried out in one stage, homopolymers of the unsaturated compounds represented by Formulae (6) and (7) are produced at about 10 wt % in some cases. On the other hand, by employing the portionwise addition method and carrying out radical polymerization in, for example, three stages, the amount of homopolymers of the unsaturated compounds represented by Formulae (6) and (7) produced can be easily reduced to less than 10 wt % under the same polymerization temperature conditions, etc.

The reaction ratio of the mercapto group-containing silane compound represented by Formula (8) and the unsaturated compounds represented by Formulae (6) and (7) is not particularly limited either, but it is preferable for the amount of each of the unsaturated compounds represented by Formulae (6) and (7) in the reaction to be in the range of 0.5 to 50 mol per mol of the mercapto group-containing silane compound represented by Formula (8). This is because, when the reaction ratio is in the above-mentioned range, formation of by-products can be suppressed, and the yield of hydrolyzable silane compound can be increased. Therefore, the amount of each of the unsaturated compounds represented by Formulae (6) and (7) in the reaction is more preferably in the range of 1 to 45 mol per mol of the mercapto group-containing silane compound represented by Formula (8), and yet more preferably in the range of 5 to 40 mol.

The reaction ratio between the unsaturated compounds represented by Formulae (6) and (7) is not limited either, but the amount of the unsaturated compound represented by Formula (6) in the reaction is preferably in the range of 100 to 1 mol relative to 100 mol of the total amount of the unsaturated compounds represented by Formulae (6) and (7), and more preferably in the range of 100 to 5 mol.

As the radical initiator, an azo radical initiator or an organic peroxide is preferable, and the azo radical initiator is more preferable. Preferred examples of the azo radical initiator include 2,2'-azobisisobutyronitrile, 1,1'-azobis(cyclohexane-1-carbonitrile), 2,2'-azobis(4-methoxy-2,4-dimethylvaleronitrile), 2,2'-azobis(2,4-dimethylvaleronitrile), and 2,2'-azobis(2-methylbutyronitrile).

The amount of radical initiator added is preferably in the range of 0.001 to 20 parts by weight relative to 100 parts by weight of the total amount of the unsaturated compounds represented by Formulae (6) and (7) and the mercapto group-containing silane compound represented by Formula (8), more preferably in the range of 0.1 to 10 parts by weight, and yet more preferably in the range of 0.1 to 5 parts by weight.

The reaction temperature when reacting the mercapto group-containing silane compound represented by Formula (8) with the unsaturated compounds represented by Formulae (6) and (7) is not particularly limited, but it is preferably in the range of, for example, −50° C. to 200° C. This is because, when the reaction temperature is in the above-mentioned range, the reactivity of these compounds increases, the type of solvent that can be used is not limited, and side reactions are suppressed. The reaction temperature is therefore more preferably in the range of 0° C. to 100° C., and yet more preferably in the range of 30° C. to 100° C. Furthermore, when an unsaturated compound that has a high rate of radical homopolymerization, such as acrylic acid, is used as the unsaturated compound of the present invention, the reaction temperature is most preferably in the range of 30° C. to 70° C. Setting the reaction temperature in this range enables the homopolymerization of unsaturated compounds to be suppressed more efficiently while maintaining the reaction rate.

Although the reaction time depends on the reaction temperature, etc., it is preferable for the reaction time to be in the range of 0.5 to 100 hours from the viewpoint of the relationship between certainty of reaction and productivity, and it is more preferably in the range of 1 to 24 hours.

When reacting the mercapto group-containing silane compound represented by Formula (8) and the unsaturated compounds represented by Formulae (6) and (7), in order to carry out the reaction uniformly, it is preferable to use a solvent. Examples of such a solvent include ethyl lactate, methyl ethyl ketone, cyclohexanone, dimethyl sulfoxide, ethylene glycol monobutyl ether acetate, diethyldiglycol, methylpropylene glycol, diacetone alcohol, methoxypropyl acetate, diethylene glycol monobutyl ether acetate, diethylene glycol monoethyl ether acetate, ethyl 3-ethoxypropionate, diethylene glycol dimethyl ether, N,N-dimethylacetamide, 1,3-dimethyl-2-imidazolidinone, methyl 3-methoxypropionate, 2-heptanone, toluene, tetrahydrofuran, dioxane, chloroform, hexane, methanol, and ethanol, and they can be used singly or in a combination of two or more solvents. The amount of solvent used is preferably in the range of 1 to 10,000 parts by weight relative to 100 parts by weight of the total amount of the mercapto group-containing silane compound represented by Formula (8) and the unsaturated compounds represented by Formulae (6) and (7), more preferably in the range of 50 to 1,000 parts by weight, and particularly preferably in the range of 50 to 800 parts by weight.

The reaction atmosphere under which the mercapto group-containing silane compound represented by Formula (8) and the unsaturated compounds represented by Formulae (6) and (7) are reacted is not particularly limited, but the radical reaction of these compounds is preferably carried out after subjecting the reaction system to, for example, nitrogen bubbling or deoxygenation by means of ultrasound. This is because carrying out the radical reaction in nitrogen, etc. is able to efficiently suppress the formation of a disulfide compound due to a coupling reaction between mercapto groups. That is, when the coupling reaction between mercapto groups occurs, coloration is often caused, but this can be prevented effectively, and a highly transparent hydrolyzable silane compound can be obtained. With regard to the reaction atmosphere, when water is present in the reaction system, the alkoxy group is spontaneously hydrolyzed during the radical reaction, which is a problem. In particular, when subjecting a carboxy group-containing hydrolyzable silane to a radical reaction, the alkoxy group is easily hydrolyzed even in the presence of a small amount of water. Because of this, when the starting materials are liquids, it is preferable to subject them beforehand to a dehydration treatment using a dehydrating agent such as, for example, a molecular sieve, calcium hydride, or magnesium sulfate or, if necessary, to a distillation treatment under nitrogen in the presence of these desiccants.

The molecular weight of the compound represented by Formula (1) is not particularly limited, but the weight-average molecular weight thereof is preferably 1,000 to 100,000, more preferably 1,000 to 50,000, and yet more preferably 1,000 to 30,000.

The film-forming composition of the present invention preferably comprises a hydrolysis product and/or a condensation product of the compound represented by Formula (1), as well as at least one type of silane compound selected from the group consisting of a compound represented by Formula (2) below and a compound represented by Formula (3) below.

The compound represented by Formula (2) is now explained. The compound represented by Formula (2) is also called 'Compound (2)'.

$$Si(OR^{11})_4 \tag{2}$$

(In the formula, $R^{11}$ denotes a monovalent organic group.)

In Formula (2) above, $R^{11}$ denotes a monovalent organic group. Examples of the monovalent organic group include an alkyl group, an alkylene group, and an aryl group. The alkyl group is preferably a lower alkyl group having 1 to 5 carbons; examples thereof include methyl, ethyl, propyl, and butyl, these alkyl groups may be chain-like or branched, and a hydrogen atom thereof may be replaced with a fluorine atom, etc. Examples of the alkylene group include vinyl and allyl. Examples of the aryl group include phenyl, naphthyl, and fluorophenyl.

$R^{11}$ is preferably a lower alkyl group or phenyl.

Specific examples of the compound represented by Formula (2) include tetramethoxysilane, tetraethoxysilane, tetra-n-propoxysilane, tetra-iso-propoxysilane, tetra-n-butoxysilane, tetra-sec-butoxysilane, tetra-tert-butoxysilane, and tetraphenoxysilane. They can be used singly or in a combination of two or more types.

The compound represented by Formula (3) is now explained. The compound represented by Formula (3) is also called 'Compound (3)'.

$$R^{12}{}_aSi(OR^{13})_{4-a} \tag{3}$$

(In the formula, $R^{12}$ denotes a hydrogen atom, a fluorine atom, or a monovalent organic group, $R^{13}$ denotes a monovalent organic group or an organosilicon group, and a denotes an integer of 1 or 2.)

In Formula (3) above, examples of the monovalent organic groups denoted by $R^{12}$ and $R^{13}$ include an alkyl group, an alkylene group, and an aryl group. The alkyl group is preferably a lower alkyl group having 1 to 5 carbons; examples thereof include methyl, ethyl, propyl, and butyl, these alkyl groups can be chain-like or branched, and a hydrogen atom thereof can be replaced with a fluorine atom, etc. Examples of the alkylene group include vinyl and allyl. Examples of the aryl group include phenyl, naphthyl, and fluorophenyl.

The organosilicon group denoted by $R^{13}$ is an organosilicon group having three substituents selected freely from the above-mentioned monovalent organic groups, and preferably selected from the group consisting of the above-mentioned lower alkyl groups and aryl groups.

$R^{12}$ and $R^{13}$ are preferably lower alkyl groups or phenyl.

Specific examples of the compound represented by Formula (3) include trialkoxysilanes such as trimethoxysilane and triethoxysilane; triarylsilanes such as triphenoxysilane; fluorotrialkoxysilanes such as fluorotrimethoxysilane and fluorotriethoxysilane; fluorotriphenoxysilane;

alkyltrimethoxysilanes such as methyltrimethoxysilane and ethyltrimethoxysilane; alkyltriethoxysilanes such as methyltriethoxysilane and ethyltriethoxysilane; alkyltri-n-propoxysilanes such as methyltri-n-propoxysilane and ethyltri-n-propoxysilane; alkyltri-isopropoxysilanes such as methyltri-iso-propoxysilane and ethyltri-iso-propoxysilane; alkyltri-n-butoxysilanes such as methyltri-n-butoxysilane and ethyltri-n-butoxysilane; alkyltri-sec-butoxysilanes such as methyltri-sec-butoxysilane and ethyltri-sec-butoxysilane; alkyltri-tert-butoxysilanes such as methyltri-tert-butoxysilane and ethyltri-tert-butoxysilane; alkyltriphenoxysilanes such as methyltriphenoxysilane and ethyltriphenoxysilane; phenyltrimethoxysilane, phenyltriethoxysilane, phenyltri-n-propoxysilane, phenyltri-isopropoxysilane, phenyltri-n-butoxysilane, phenyltri-sec-butoxysilane, phenyltri-tert-butoxysilane, phenyltriphenoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane;

dialkyidimethoxysilanes such as dimethyldimethoxysilane and diethyldimethoxysilane; dialkyldiethoxysilanes such as dimethyldiethoxysilane and diethyldiethoxysilane; dialkyldi-n-propoxysilanes such as dimethyldi-n-propoxysilane and diethyldi-n-propoxysilane; dialkyldi-isopropoxysilanes such as dimethyldi-iso-propoxysilane and diethyldi-iso-propoxysilane; dialkyldi-n-butoxysilanes such as dimethyldi-n-butoxysilane and diethyldi-n-butoxysilane; dialkyldi-sec-butoxysilanes such as dimethyldi-sec-butoxysilane and diethyldi-sec-butoxysilane; dialkyldi-tert-butoxysilanes such as dimethyidi-tert-butoxysilane and diethyldi-tert-butoxysilane; dialkyldiphenoxysilanes such as dimethyldiphenoxysilane and diethyldiphenoxysilane; diphenyldimethoxysilane, diphenyldiethoxysilane, diphenyldi-n-propoxysilane, diphenyldi-iso-propoxysilane, diphenyldi-n-butoxysilane, diphenyldi-sec-butoxysilane, diphenyldi-tert-butoxysilane, diphenyidiphenoxysilane, and divinyldimethoxysilane.

Preferred examples of Compound (3) include methyltrimethoxysilane, methyltriethoxysilane, methyltri-n-propoxysilane, methyltri-isopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane. They can be used singly or in a combination of two or more types.

In the present invention, with regard to combinations of Compounds (1), (2), and (3) that constitute Component (A), Compounds (1) and (2); (1) and (3); (1), (2), and (3) can be cited. Each of Compounds (1), (2), and (3) above can be a combination of two or more types. When each component of Component (A) is converted into a completely hydrolyzed/condensed product, Compound (1) is 5 to 75 wt % of the total amount of Component (A), preferably 10 to 70 wt %, and more preferably 15 to 70 wt %. Compounds (1) and/or (2) are 95 to 25 wt % of the total amount of Component (A), preferably 90 to 30 wt %, and more preferably 85 to 30 wt %. When a silicate compound is 5 to 75 wt % of the total amount of Component (A), the coating obtained has excellent resistance to CMP and is particularly excellent in terms of low permittivity. The completely hydrolyzed/condensed product referred to in the present invention means that all of Component (A) is 100% hydrolyzed and completely condensed to give a siloxane structure.

In the present invention, by carrying out hydrolysis in the presence of a nitrogen onium salt compound (B), a film-forming composition that can give a coating having a permittivity whose temperature dependency is suppressed can be obtained. The nitrogen onium salt compound that can be used in the present invention is a salt formed from a nitrogen-containing cationic group (B-1) and an anionic group-containing group (B-2). In the present invention, the anionic group is a halogen ion, a hydroxyl group, a nitrate group, a carbonate group, a carboxyl group, a sulfonyl group, a phosphonyl group, a carbonyl group, or a phenoxy group. Examples of Component (B) include a compound represented by Formula (4) below and a compound represented by Formula (5).

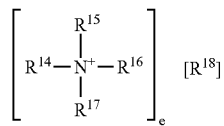

(4)

(5)

(In the formulae, $R^{14}$ to $R^{17}$ may be identical to or different from each other and independently denote a hydrogen atom, an alkyl group having 1 to 10 carbons, a hydroxyalkyl group having 1 to 10 carbons, an aryl group having 6 to 12 carbons, or an arylalkyl group having 7 to 16 carbons; $R^{18}$ denotes an e-valent anionic group, e denotes an integer of 1 to 4, $R^{19}$ denotes a g-valent cyclic cationic group containing a nitrogen atom, $R^{20}$ denotes an f-valent anionic group containing a halogen atom, h denotes the number of $R^{20}$ groups necessary to neutralize the cationic charge in the $R^{19}$ group, f denotes an integer of 1 to 4, g denotes an integer of 1 to f, and g=f×h.)

In the above-mentioned formulae, examples of the alkyl group having 1 to 10 carbons include methyl, ethyl, propyl, butyl, and hexyl, examples of the aryl group having 6 to 12 carbons include phenyl and tolyl, examples of the arylalkyl group having 7 to 16 carbons include benzyl, and examples of the halogen atom include chlorine and bromine. The mono- to tetra-valent anionic group referred to above is a group derived from a compound having 1 to 4 anionic groups, the g-valent cyclic cationic group containing a nitrogen atom is a group derived from an aromatic compound having g nitrogen atoms, a heterocyclic compound having g nitrogen atoms, or an alicyclic compound having g nitrogen atoms.

Examples of the compound represented by Formula (4) include ammonium salts such as ammonium hydroxide, ammonium chloride, and ammonium acetate; tetramethylammonium salts such as tetramethylammonium hydroxide, tetramethylammonium chloride, tetramethylammonium nitrate, tetramethylammonium sulfate, tetramethylammonium hydrogen sulfate, tetramethylammonium phosphate, tetramethylammonium carbonate, tetramethylammonium phenoxide, tetramethylammonium acetate, tetramethylammonium benzoate, tetramethylammonium phthalate, tetramethylammonium salicylate, tetramethylammonium succinate, tetramethylammonium maleate, and tetramethylammonium propionate.

Examples of the compound represented by Formula (5) include pyridinium salts such as pyridinium hydroxide, pyridinium chloride, and pyridinium maleate; diazabicyclooctane salts such as diazabicyclooctane hydrochloride, diazabicyclooctane nitrate, and diazabicyclooctane acetate; diazabicyclononane salts such as diazabicyclononane hydrochloride, diazabicyclononane nitrate, and diazabicyclononane acetate; and diazabicycloundecene salts such as diazabicycloundecene hydrochloride, diazabicycloundecene nitrate, diazabicycloundecene sulfate, diazabicycloundecene acetate, and diazabicycloundecene maleate. Among these compounds, nitrogen onium hydroxide compounds and nitrogen onium carboxylate compounds can be cited as preferred examples, and ammonium hydroxide compounds and ammonium carboxylate compounds are particularly preferable. These Components (B) can be used singly or in a combination of two or more types.

The amount of Component (B) used is usually 0.00001 to 1 mol per mol of the total amount of SiOH groups generated by hydrolysis of Component (A), and is preferably 0.00005 to 0.5 mol. When the amount of (B) used is in the above-mentioned range, there is no possibility of the polymer precipitating or gelling during the reaction. When hydrolyzing and condensing Component (A), it is preferable to use 0.5 to 150 mol of water (C) per mol of Component (A), and it is particularly preferable to add 0.5 to 130 mol of water. When the amount of water added is in the above-mentioned range, the coating obtained has excellent resistance to cracking, and the polymer does not precipitate or gel during the hydrolysis and condensation reactions. With regard to an alcohol (D) having a boiling point of 100° C. or less that is used when hydrolyzing Component (A) of the present invention, methanol, ethanol, n-propanol, and isopropanol can be cited as examples. The amount of alcohol (D) added is usually 3 to 100 mol per mol of Component (A), and preferably 5 to 80 mol. The concentration of Component (A) when hydrolyzing is 0.5 to 10% (on the basis of a completely hydrolyzed/condensed product), and preferably 1 to 8%. The reaction temperature in this process is usually 0° C. to 100° C., and preferably 15° C. to 90° C.

(Method for Hydrolyzing Component (A))

When hydrolyzing Component (A), Component (A) is continuously or intermittently added to a solvent so as to hydrolyze it; it may also be condensed, and although this is not particularly limited, there is a method in which a predetermined amount of Component (A) is added to a mixture of Component (D), water, and Component (B) so as to carry out hydrolysis and condensation reactions. It is also possible to employ a method described in JP-A-2002-20689.

After hydrolyzing and condensing Component (A), it is preferable to adjust the pH of the film-forming composition to 7 or less. As a method for adjusting the pH, there is a method in which a pH adjusting agent is added, and there is a method in which Component (B) is distilled off from the composition. These methods can be used in combination.

As the above-mentioned pH adjusting agent, an inorganic acid and an organic acid can be cited. Examples of the inorganic acid include hydrochloric acid, nitric acid, sulfuric acid, and phosphoric acid. Examples of the organic acid include acetic acid, propionic acid, oxalic acid, maleic acid, citric acid, tartaric acid, succinic acid, fumaric acid, itaconic acid, mesaconic acid, citraconic acid, malic acid, a hydrolysis product of glutaric acid, a hydrolysis product of maleic anhydride, and a hydrolysis product of phthalic anhydride. These compounds can be used singly or in combination of two or more types.

The pH of the composition is adjusted by the above-mentioned pH adjusting agent to 7 or less, and preferably so as to be in the range of 1 to 6. By adjusting the pH so as to be in the above-mentioned range, an effect of improving the storage stability of the resulting composition can be obtained. The amount of pH adjusting agent used is determined appropriately.

The film-forming composition of the present invention is dissolved in a solvent, and applied on a support. Preferred examples of the solvent that can be used include ethylene dichloride, cyclohexanone, cyclopentanone, 2-heptanone, methyl isobutyl ketone, γ-butyrolactone, methyl ethyl ketone, methanol, ethanol, dimethylimidazolidinone, ethylene glycol monomethyl ether, ethylene glycol monoethyl ether, ethylene glycol dimethyl ether, 2-methoxyethyl acetate, ethylene glycol monoethyl ether acetate, propylene glycol monomethyl ether (PGME), propylene glycol monomethyl ether acetate (PGMEA), tetraethylene glycol dimethyl ether, triethylene glycol monobutyl ether, triethylene glycol monomethyl ether, isopropanol, ethylene carbonate, ethyl acetate, butyl acetate, methyl lactate, ethyl lactate, methyl methoxypropionate, ethyl ethoxypropionate, methyl pyruvate, ethyl pyruvate, propyl pyruvate, N,N-dimethylformamide, dimethylacetamide, dimethylsulfoxide, N-methylpyrrolidone, tetrahydrofuran, diisopropylbenzene, toluene, xylene, and mesitylene, and these solvents can be used singly or in combination.

Among these solvents, preferred solvents include propylene glycol monomethyl ether acetate, propylene glycol monomethyl ether, 2-heptanone, cyclohexanone, γ-butyrolactone, ethylene glycol monomethyl ether, ethylene glycol monoethyl ether, ethylene glycol monoethyl ether acetate, propylene glycol monomethyl ether, propylene glycol monoethyl ether, ethylene carbonate, butyl acetate, methyl lactate, ethyl lactate, methyl methoxypropionate, ethyl ethoxypropionate, N-methylpyrrolidone, N,N-dimethylformamide, tetrahydrofuran, methyl isobutyl ketone, xylene, mesitylene, and diisopropylbenzene.

The total solids content of the composition of the present invention thus obtained is preferably 2 to 30 wt %, and is adjusted appropriately according to the intended purpose. When the total solids content of the composition is in the range of 2 to 30 wt %, the film thickness of the coating is in an appropriate range, and the storage stability is excellent.

When the film-forming composition of the present invention thus obtained is applied to a substrate such as a silicon wafer, an $SiO_2$ wafer, or an SiN wafer, coating means such as a spin coating method, a dipping method, a roll coating method, or a spraying method is employed.

During this process, the dry film thickness is on the order of 0.05 to 1.5 μm from coating once, and on the order of 0.1 to 3 μm from coating twice. Subsequently, by drying at room temperature or heating at a temperature of on the order of 80° C. to 600° C. for normally on the order of 5 to 240 minutes, an insulating film of a glass substance or a macromolecule, or a mixture thereof can be formed. With regard to the heating method in this process, a hot plate, an oven, a furnace, etc. can be used, and the heating atmosphere can be air, a nitrogen atmosphere, an argon atmosphere, vacuum, a reduced pressure atmosphere in which the concentration of oxygen is controlled, etc.

More specifically, the film-forming composition of the present invention is applied to a substrate (normally a substrate having metal wiring) by, for example, a spin coating method, dried by a first thermal treatment at a temperature of 300° C. or less so as to remove the solvent and crosslink the siloxane contained in the film-forming composition, and then subjected to a second thermal treatment (annealing) at a temperature that is higher than 300° C. but no higher than 450° C., thus giving a low permittivity insulating film. The first thermal treatment is carried out at 300° C. or less so that the crosslinking does not proceed excessively and the degree of crosslinking can be regulated easily. The second thermal treatment is carried out at a temperature that is higher than 300° C. but no higher than 450° C. because this temperature range is generally convenient for annealing.

Crosslinking of the siloxane by the first thermal treatment proceeds by forming an Si—O—Si bond by oxidation, and this first thermal treatment can be carried out advantageously in air. It is also possible to regulate the degree of crosslinking in order to adjust the permittivity of the insulating film formed, and this degree of crosslinking can be regulated by adjusting the temperature and time of the thermal treatment. It is surmised that decomposition of organic components, which is a characteristic of the present invention, proceeds after crosslinking of the siloxane component has proceeded sufficiently.

Furthermore, one characteristic of the present invention is to carry out porosification by controlling the porosity when forming the film.

The 'porous' referred to in the present invention means a porosity of at least 10 vol %, preferably at least 20 vol % and at most 80 vol %, and yet more preferably at least 30 vol % and at most 70 vol %.

By carrying out porosification, an insulating film having a lower permittivity, that is, a porous film having a permittivity of 2.5 or less, and preferably 2.1 or less, can be obtained. The method for porosification can employ the film-forming composition of the present invention without further treatment, but a more porous material (pyrogel) can be obtained by mixing the film-forming composition with a pyrolytic or gas reactive substance, curing the matrix, and then removing the reactive substance.

More specifically, there is a porosification method that involves, for example, adding to the film-forming composition a porosifying compound that is compatible with or dispersible in the film-forming composition and has a boiling point or a decomposition temperature of 250° C. to 450° C., coating a substrate therewith, then heating it at a temperature that is less than the boiling point or the decomposition temperature of the compound so as to partially cure the film-forming composition of the present invention, and subsequently heating it at a temperature that is equal to or higher than the boiling point or the decomposition temperature of the porosifying compound so as to carry out curing, that is, curing while generating a gas as a result of boiling or decomposition.

Examples of the porosifying compound include (a) a compound having a polyalkylene oxide structure, (b) a compound having a sugar chain structure, (c) a vinyl amide polymer, (d) (meth)acrylate polymer, (e) an aromatic vinyl polymer, (f) a dendrimer, (g) a lipophilic compound and a dispersant, and (h) ultrafine particles. The boiling point and the decomposition temperature referred to in the present invention mean temperatures at 1 atm.

(a) Compound Having a Polyalkylene Oxide Structure

Examples of the polyalkylene oxide structure include a polyethylene oxide structure, a polypropylene oxide structure, a polytetramethylene oxide structure, and a polybutylene oxide structure. Specific examples include ether compounds such as a polyoxyethylene alkyl ether, a polyoxyethylene alkyl phenyl ether, a polyoxyethylene sterol ether, a polyoxyethylene lanolin derivative, an ethylene oxide derivative of an alkyl phenol formalin condensation product, a polyoxyethylene polyoxypropylene block copolymer, and a polyoxyethylene polyoxypropylene alkyl ether; ether ester compounds such as a polyoxyethylene glycerol fatty acid ester, a polyoxyethylene sorbitan fatty acid ester, a polyoxyethylene sorbitol fatty acid ester, and a polyoxyethylene fatty acid alkanol amide sulfate, a polyethylene glycol fatty acid ester, an ethylene glycol fatty acid ester, a fatty acid monoglyceride, a polyglycerol fatty acid ester, a sorbitan fatty acid ester, a propylene glycol fatty acid ester, and a sucrose fatty acid ester.

(b) Compound Having a Sugar Chain Structure

Examples of the compound having a sugar chain structure include cyclodextrin, starch, a sucrose ester, an oligosaccharide, glucose, fructose, mannitol, starch sugar, D-sorbitol, dextran, xanthan gum, curdlan, pullulan, cycloamylose, isomerized sugar, maltitol, cellulose acetate, cellulose, carboxymethyl cellulose, hydroxyethyl cellulose, hydroxypropyl cellulose, methyl cellulose, carboxymethyl cellulose, chitin, and chitosan.

The compound having a sugar chain structure used in the present invention preferably has a part or all of the hydroxyl groups or amino groups modified. Examples of chemical modification of the hydroxyl group include etherification, esterification, and modification involving a trialkylsilyl bond or a urethane bond. Examples of chemical modification of the amino group include introduction of an amide bond, a urea bond, or an imide bond. Among the compounds having a sugar chain structure, cyclodextrin is preferable because the pore size after decomposition is small and controllable, and among the chemical modifications, modification involving a trialkylsilyl or urethane bond is preferable, and modification involving a trimethylsilyl bond is particularly preferable. In order to modify the compound having a sugar chain structure with a trimethylsilyl group, the compound having a sugar chain structure is reacted with a trimethylsilylating agent such as trimethylchlorosilane or dimethylchlorosilylacetamide, and 5% to 100% of the hydroxyl groups of the compound having a sugar chain structure are usually substituted. In order to bond the compound having a sugar chain structure via a urethane group, the compound having a sugar chain structure is reacted with a urethane-forming agent such as phenyl isocyanate or hexyl isocyanate, and 5% to 100% of the hydroxyl groups of cyclodextrin are usually reacted.

(c) Vinyl Amide Polymer

Examples of the vinyl amide polymer include poly(N-vinylacetamide), poly(N-vinylpyrrolidone), poly(2-methyl-2-oxazoline), and poly(N,N-dimethylacrylamide).

(d) (Meth)acrylate Polymer

Examples of the (meth)acrylate polymer include polymers of radically polymerizable monomers having, as a main component, a (meth)acrylate ester such as methyl (meth)acrylate, ethyl (meth)acrylate, butyl (meth)acrylate, benzyl (meth)acrylate, tetrahydrofurfuryl (meth)acrylate, glycidyl (meth)acrylate, hydroxyethyl (meth)acrylate, (meth)acrylamide, or hydroxypropyl (meth)acrylate.

(e) Aromatic Vinyl Polymer

Examples of the aromatic vinyl polymer include polystyrene, polymethyl styrene, and poly(α-methyl styrene).

(f) Dendrimer

Examples of the dendrimer include a benzyl ether system, phenylacetylene, a polyamine system, and a polyamide system, and the polyamine system is preferable from the viewpoint of ease of thermal decomposition.

(g) Lipophilic Compound and Dispersant

In order to carry out porosification, a lipophilic compound and a dispersant can be added. The lipophilic compound alone is not compatible over a wide composition range with the organopolysiloxane having a cage type structure of the present invention, but the lipophilic compound becomes compatible with the organopolysiloxane of the present invention over a wide composition range in the presence of a dispersant. Examples of the lipophilic compound include polycarboxylic esters such as didecyl phthalate, diundecyl phthalate, didodecyl phthalate, ditridecyl phthalate, tris(2-ethylhexyl) trimellitate, tridecyl trimellitate, tridodecyl trimellitate, tetrabutyl pyromellitate, tetrahexyl trimellitate, tetraoctyl pyromellitate, bis(2-ethylhexyl)dodecanedioate, and bisdecyldodecanedioate. Examples of the dispersant that can make these lipophilic compounds compatible include higher alcohols such as octanol, lauryl alcohol, decyl alcohol, and undecyl alcohol. The amount of higher alcohol used as the dispersant is 0.1 to 10 times (weight) based on the lipophilic compound.

(h) Ultrafine Particles

The ultrafine particles are polymer particles having a particle size of 100 nm or less; the particle size is controlled in normal emulsion polymerization by the type of emulsifier, the concentration of the emulsifier, the stirring speed, etc., and they are prepared from a monomer such as an aromatic vinyl compound or a (meth)acrylate compound using a crosslinking monomer for controlling the particle size.

The amount of the above porosifying compounds used in order to obtain a porous insulating film is usually 5 to 75 wt % of a resin or a low molecular weight compound having the structure of Formula (1) of the present invention. In this range, an effective reduction in permittivity can be expected without causing degradation of the mechanical strength.

Furthermore, with regard to other porosification methods, there is, for example, a method in which hollow fine particles are added, a method in which a wet gel film is dried without shrinkage, a method in which a highly regular silica film is formed using a surfactant as a template, and an aerosol method using a supercritical drying system.

The interlayer insulating film thus obtained has excellent insulation, coated film uniformity, permittivity characteristics, resistance to coating cracking, and coating surface hardness, and is therefore useful as an interlayer insulating film for LSI, system LSI, DRAM, SDRAM, RDRAM, D-RDRAM, etc. semiconductor devices, as a protective film such as a surface coating film of a semiconductor device, as an interlayer insulating film of a multilayer wiring substrate, as a protective film or an insulation film for a liquid crystal device, etc.

In accordance with the present invention, a silicon-based film having an appropriate, uniform thickness, which is suitable as an interlayer insulating film of a semiconductor device, etc., can be formed and, moreover, a porous silicon-based film having excellent thermal resistance, permittivity characteristics and, in particular, resistance to CMP can be formed.

EXAMPLES

The present invention is explained below in further detail with reference to Examples. In the Examples, parts and % denote parts by weight and wt % respectively unless otherwise specified. Evaluation of the film-forming compositions in the Examples was carried out by the following measurements.

Permittivity

A 6 inch silicon wafer was coated with a composition sample by a spin coating method, and the substrate was dried on a hot plate at 80° C. for 5 minutes and 200° C. for 5 minutes, and further calcined in an oven under a nitrogen atmosphere at 450° C. for 60 minutes. Aluminum was vapor-deposited on the substrate thus obtained, thereby giving a substrate for evaluation of the permittivity. The permittivity was calculated from the capacitance at 10 kHz using HP16451B electrodes and an HP4284A precision LCR meter manufactured by Yokogawa-Hewlett-Packard Co. or a system 1296/1260 manufactured by Solartron Analytical.

Resistance to CMP

The film obtained was polished under the conditions below.
Slurry: silica-hydrogen peroxide based
Polishing pressure: 300 g/cm$^2$
Polishing time: 60 seconds
Evaluation was carried out using the criteria below.
Good: No change.
Poor: Partly peeled off or damaged.

Synthetic Example 1

Synthesis of Compound 1

A 500 ml three-necked flask was charged with 50 g of methyl methacrylate, 3.4 g of mercaptopropyltrimethoxysilane, and 220 g of dimethylformamide, and 0.5 g of 2,2-azobis(2,4-dimethylvaleronitrile) was added thereto at 65° C. under a flow of nitrogen. After maintaining the temperature while stirring for 6 hours, the mixture was cooled to room temperature. When the mixture was poured into 2 L of water, a solid precipitated. Compound 1 having a dry weight of 52.4 g was obtained. It was found by GPC (polystyrene standard) that the weight-average molecular weight of the polymer was 3,000, and it was also found by $^{13}$C—NMR (DMSO-d$_6$) that a trimethoxysilyl group (50.0 ppm) was introduced at the polymer terminal.

Synthetic Example 2

A quartz separable flask was charged with 471 g of ethanol, 237 g of ion-exchanged water, and 17.2 g of a 25% aqueous solution of tetramethylammonium hydroxide, and the solution was heated to 55° C. and stirred uniformly. To this solution was added a mixture of 20 g of Compound 1, 34.9 g of methyltrimethoxysilane, and 58.6 g of tetraethoxysilane. A reaction was carried out for 2 hours while maintaining the solution at 55° C. To this solution were added 28 g of a 20% aqueous solution of maleic acid and 440 g of propylene glycol monopropyl ether. Subsequently, the solution was concentrated to 10% (on the basis of a completely hydrolyzed/condensed product) at 50° C. using an evaporator. 300 g of ethyl acetate and 300 g of ion-exchanged water were added to this solution, and liquid-liquid extraction was carried out. The upper layer solution was collected and concentrated to 10% (on the basis of the completely hydrolyzed/condensed product) at 50° C. using an evaporator, and Reaction Mixture 1 was thus obtained.

Example 1

Reaction Mixture 1 was filtered using a Teflon (registered trademark) filter having a pore size of 0.2 μm, thus giving a film-forming composition of the present invention. The composition thus obtained was applied to a silicon wafer by a spin coating method and calcined, thus giving a coating. Evaluation results of this coating are given in Table 1.

Comparative Example 1

A quartz separable flask was charged with 237 g of ion-exchanged water and 17.2 g of a 25% aqueous solution of tetramethylammonium hydroxide, and the mixture was stirred uniformly. To this solution was added a mixture of 34.9 g of methyltrimethoxysilane and 58.6 g of tetraethoxysilane. A reaction was carried out for 2 hours while maintaining the solution at 55° C. To this solution were added 28 g of a 20% aqueous solution of maleic acid and 440 g of propylene glycol monopropyl ether. Subsequently, the solution was concentrated to 10% (on the basis of a completely hydrolyzed/condensed product) at 50° C. using an evaporator. 300 g of ethyl acetate and 300 g of ion-exchanged water were added to this solution, and liquid-liquid extraction was carried out. The upper layer solution was collected and concentrated to 10% (on the basis of the completely hydrolyzed/condensed product) at 50° C. using an evaporator, and Reaction Mixture 2 was thus obtained. 120 parts by weight of a polyethylene oxide block-polypropylene oxide block-polyethylene oxide block copolymer (Newpol PE61, manufactured by Sanyo Chemical Industries, Ltd.) was added to 100 parts by weight of Component (A) of Reaction Mixture 2. This solution was filtered using a Teflon (registered trademark) filter having a pore size of 0.2 μm, thus giving a film-forming composition. The composition thus obtained was applied to a silicon wafer by a spin coating method and then calcined, thus giving a coating. Evaluation results of this coating are given in Table 1.

TABLE 1

|  | Permittivity | Resistance to CMP |
|---|---|---|
| Example 1 | 1.95 | Good |
| Comparative Example 1 | 2.01 | Poor |

The films formed in Example 1 and Comparative Example 1 were found to be porous when examined by transmission electron microscopy (TEM). Furthermore, the pores of the porous film formed in Example 1 had better uniformity than the pores of the porous film formed in Comparative Example 1.

The invention claimed is:

1. An insulating film formed by thermally treating a film-forming composition comprising a hydrolysis product and/or a condensation product of a compound represented by Formula (1) below:

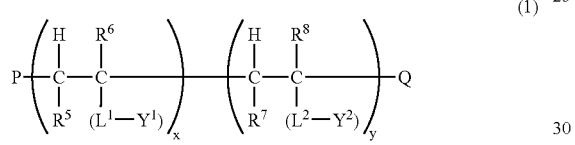
(1)

wherein at least one of P and Q is a silane coupling group represented by $-L^3-Si(R^3)_m(OR^4)_{3-m}$, $R^3$, $R^4$, $R^5$, $R^6$, $R^7$, and $R^8$ independently denote a hydrogen atom or a hydrocarbon group having 1 to 8 carbons, m denotes 0, 1, or 2, x denotes a range of 100 to 1 mol %, y denotes a range of 0 to 99 mol %, and P and Q terminal groups; $L^1$, $L^2$, and $L^3$ independently denote a single bond or a divalent organic linking group, $Y^1$ and $Y^2$ independently denote $-N(R^9)(R^{10})$, $-OH$, $-NR^0COR^9$, $-CON(R^9)(R^{10})$, $-OR^9$, $-CONR^9_2$, $-COR^9$, $-CO_2M$, $-COOR^9$, or $-SO_3M$, in which $R^0$, $R^9$, and $R^{10}$ independently denote a hydrogen atom or an alkyl group having 1 to 8 carbons, $R^0$ and $R^9$ may form a ring structure, and M denotes a hydrogen atom, an alkali metal, an alkaline earth metal, or onium, wherein said insulation film is porous.

2. The insulating film according to claim 1, wherein $L^1$ and $L^2$ in Formula (1) are single bonds and $L^3$ is an alkylenethio group.

3. The insulating film according to claim 1, wherein the film-forming composition comprises a hydrolysis product and/or a condensation product of a compound represented by Formula (1) and at least one type of silane compound selected from the group consisting of a compound represented by Formula (2) below and a compound represented by Formula (3) below:

wherein $R^{11}$ denotes a monovalent organic group,

wherein $R^{12}$ denotes a hydrogen atom, a fluorine atom, or a monovalent organic group, $R^{13}$ denotes a monovalent organic group or an organosilicon group, and a denotes an integer of 1 or 2.

4. The insulating film according to claim 3, wherein $R^{11}$ in Formula (2) is an alkyl group having 1 to 5 carbons.

5. The insulating film according to claim 3, wherein $R^{12}$ and $R^{13}$ in Formula (3) independently denote an alkyl group having 1 to 5 carbons.

6. The insulating film according to claim 1, wherein said film has a porosity of at least 20 vol % to at most 80 vol %.

7. The insulating film according to claim 1, wherein said film has a permittivity of 2.1 or less.

8. A process for producing an insulating film, comprising the steps of providing a film-forming composition comprising a hydrolysis product and/or a condensation product of a compound represented by Formula (1) below:

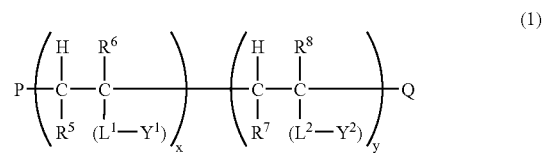
(1)

wherein at least one of P and Q is a silane coupling group represented by $-L^3-Si(R^3)_m(OR^4)_{3-m}$, $R^3$, $R^4$, $R^5$, $R^6$, $R^7$, and $R^8$ independently denote a hydrogen atom or a hydrocarbon group having 1 to 8 carbons, m denotes 0, 1, or 2, x denotes a range of 100 to 1 mol %, y denotes a range of 0 to 99 mol %, and P and Q denote terminal groups; $L^1$, $L^2$, and $L^3$ independently denote a single bond or a divalent organic linking group, $Y^1$ and $Y^2$ independently denote $-N(R^9)(R^{10})$, $-OH$, $-NR^0COR^9$, $-CON(R^9)(R^{10})$, $-OR^9$, $-CONR^9_2$, $-COR^9$, $-CO_2M$, $-COOR^9$, or $-SO_3M$, in which $R^0$, $R^9$, and $R^{10}$ independently denote a hydrogen atom or an alkyl group having 1 to 8 carbons, $R^0$ and $R^9$ may form a ring structure, and M denotes a hydrogen atom, an alkali metal, an alkaline earth metal, or onium;

adding to the film-forming composition a porosifying compound that is compatible with or dispersible in the film-forming composition and has a boiling point or a decomposition temperature ranging between 250° C. to 450° C., thereby forming a resulting composition;

coating a substrate with the resulting composition comprising the film-forming composition and the porosifying compound to obtain a coated substrate;

heating the coated substrate at a temperature that is less than the boiling point or the decomposition temperature of the porosifying compound so as to partially cure the resulting film-forming composition, and subsequently heating the coated substrate at a temperature that is equal to or higher than the boiling point or the decomposition temperature of the porosifying compound so as to further cure the resulting film-forming composition while generating a gas as a result of boiling or decomposition to obtain said insulating film, wherein said insulating film is porous.

9. The process of claim 8, wherein $L^1$ and $L^2$ in Formula (1) are single bonds and $L^3$ is an alkylenethio group.

10. The process of claim 8, wherein the film-forming composition comprises a hydrolysis product and/or a condensation product of a compound represented by Formula (1) and at least one type of silane compound selected from the group consisting of a compound represented by Formula (2) below and a compound represented by Formula (3) below:

$$Si(OR^{11})_4 \quad (2)$$

wherein $R^{11}$ denotes a monovalent organic group, $$R^{12}{}_a Si(OR^3)_{4-a} \quad (3)$$

wherein $R^{12}$ denotes a hydrogen atom, a fluorine atom, or a monovalent organic group, $R^{13}$ denotes a monovalent organic group or an organosilicon group, and a denotes an integer of 1 or 2.

11. The process of claim 8, wherein the porosifying compound is a compound having a polyalkylene oxide structure.

* * * * *